United States Patent
Kubota et al.

(10) Patent No.: US 8,187,383 B2
(45) Date of Patent: May 29, 2012

(54) SEMICONDUCTOR SINGLE CRYSTAL MANUFACTURING DEVICE AND MANUFACTURING METHOD

(75) Inventors: Toshimichi Kubota, Hiratsuka (JP); Eiichi Kawasaki, Hiratsuka (JP); Tsuneaki Tomonaga, Hiratsuka (JP); Shinichi Kawazoe, Kanagawa (JP)

(73) Assignee: Sumco Techxiv Corporation, Nagasaki (JP)

( * ) Notice: Subject to any disclaimer, the term of this patent is extended or adjusted under 35 U.S.C. 154(b) by 1074 days.

(21) Appl. No.: 12/083,896

(22) PCT Filed: Oct. 11, 2006

(86) PCT No.: PCT/JP2006/320323
§ 371 (c)(1), (2), (4) Date: Apr. 18, 2008

(87) PCT Pub. No.: WO2007/046287
PCT Pub. Date: Apr. 26, 2007

(65) Prior Publication Data
US 2009/0120352 A1 May 14, 2009

(30) Foreign Application Priority Data
Oct. 20, 2005 (JP) ................................. 2005-305855

(51) Int. Cl.
*C30B 15/02* (2006.01)
(52) U.S. Cl. .............................. 117/217; 117/30; 117/32
(58) Field of Classification Search .................. 117/217, 117/30, 32
See application file for complete search history.

(56) References Cited

U.S. PATENT DOCUMENTS
5,900,059 A * 5/1999 Shimanuki et al. ........... 117/217

FOREIGN PATENT DOCUMENTS

| JP | 02-116695 | 5/1990 |
|---|---|---|
| JP | 05-070279 | 3/1993 |
| JP | 06-016490 | 1/1994 |
| JP | 07-223894 | 8/1995 |
| JP | 07-232994 | 9/1995 |
| JP | 08-245293 | 9/1996 |
| JP | 08315882 | 12/1997 |
| JP | 10-182289 | 7/1998 |

OTHER PUBLICATIONS

Hiroshige, JP08-245293.*
Eiji, JP06-016490.*
International Search Report for PCT/JP2006/320323.

* cited by examiner

*Primary Examiner* — Bob M Kunemund
(74) *Attorney, Agent, or Firm* — Husch Blackwell LLP

(57) ABSTRACT

In order to provide a semiconductor single crystal manufacturing device and a manufacturing method using a CZ method wherein the resistivity and oxygen concentration of a silicon single crystal can be controlled and wherein a single crystal yield can be improved, in the present invention, there is provided a wall 10 which defines a chamber inner wall 1c of a chamber 1, a crucible 2 and a heater 3. The wall 10 is formed by three members, namely, a single crystal side flow-straightening member 11, a melt surface side flow-straightening member 12 and a heater side flow-straightening member 13, which are connected to form a purge gas directing path 100. When the semiconductor single crystal is pulled, a flow speed of a purge gas that passes through the vicinity of the surface of the melt in a quartz crucible 3 is controlled.

7 Claims, 5 Drawing Sheets

FIG.2(a)

SIX INCHES SILICON SINGLE CRYSTAL

| CONDITIONS | PRESSURE (torr) | Ar (l/min) | GAS FLOW SPEED (m/min) | SINGLE CRYSTAL YIELD | RESISTIVITY (ρ) | OVERALL EVALUATION |
|---|---|---|---|---|---|---|
| 1 | 760 | 50 | 0.04 | × | ○ | × |
| 2 | 600 | 50 | 0.05 | × | ○ | × |
| 3 | 450 | 50 | 0.07 | × | ○ | × |
| 4 | 760 | 100 | 0.09 | × | ○ | × |
| 5 | 600 | 100 | 0.11 | △ | ○ | △ |
| 6 | 450 | 100 | 0.15 | △ | ○ | △ |
| 7 | 200 | 50 | 0.16 | △ | ○ | △ |
| 8 | 760 | 200 | 0.17 | △ | ○ | △ |
| 9 | 600 | 200 | 0.22 | ○ | ○ | ○ |
| 10 | 450 | 200 | 0.29 | ○ | ○ | ○ |
| 11 | 200 | 100 | 0.33 | ○ | ○ | ○ |
| 12 | 760 | 400 | 0.35 | ○ | ○ | ○ |
| 13 | 600 | 400 | 0.44 | ○ | × | × |
| 14 | 450 | 400 | 0.59 | ○ | × | × |
| 15 | 200 | 200 | 0.66 | ○ | × | × |
| 16 | 200 | 400 | 1.32 | ○ | × | × |

○···PASS  △···PARTIAL PASS  ×···FAIL

FIG.2(b)

EIGHT INCHES SILICON SINGLE CRYSTAL

| CONDITIONS | PRESSURE (torr) | Ar (l/min) | GAS FLOW SPEED (m/min) | SINGLE CRYSTAL YIELD | RESISTIVITY (ρ) | OVERALL EVALUATION |
|---|---|---|---|---|---|---|
| 1 | 760 | 50 | 0.03 | × | ○ | × |
| 2 | 600 | 50 | 0.04 | × | ○ | × |
| 3 | 450 | 50 | 0.05 | × | ○ | × |
| 4 | 760 | 100 | 0.06 | × | ○ | × |
| 5 | 600 | 100 | 0.08 | × | ○ | × |
| 6 | 450 | 100 | 0.11 | × | ○ | × |
| 7 | 200 | 50 | 0.12 | × | ○ | × |
| 8 | 760 | 200 | 0.13 | × | ○ | × |
| 9 | 600 | 200 | 0.16 | × | ○ | × |
| 10 | 450 | 200 | 0.21 | ○ | ○ | ○ |
| 11 | 200 | 100 | 0.24 | ○ | ○ | ○ |
| 12 | 760 | 400 | 0.25 | ○ | ○ | ○ |
| 13 | 600 | 400 | 0.32 | ○ | ○ | ○ |
| 14 | 450 | 400 | 0.43 | ○ | × | × |
| 15 | 200 | 200 | 0.48 | ○ | × | × |
| 16 | 200 | 400 | 1.96 | ○ | × | × |

○···PASS  △···PARTIAL PASS  ×···FAIL

US 8,187,383 B2

SEMICONDUCTOR SINGLE CRYSTAL MANUFACTURING DEVICE AND MANUFACTURING METHOD

TECHNICAL FIELD

The present invention relates to a device and a method for manufacturing a single crystal using the Czochralski method, particularly to a device and a method for manufacturing a silicon single crystal with a dopant mixed therein.

BACKGROUND

Currently, in order to lower the resistivity of N-type silicon single crystals, the silicon (Si) is mixed with a dopant such as metallic arsenic (As), antimony (Sb) or phosphorus (P). Also, concurrently, the oxygen concentration of the silicon single crystal is sought to be controlled to a prescribed value in order to perform intrinsic gettering (hereinbelow called IG) of the wafer.

As shown for example in FIG. 5, the chief constituent elements of a CZ device are: a crucible 2 arranged in a chamber 1; a heater 6 provided at the periphery of the crucible 2; a heat insulating body 7 provided at the outer periphery of the heater 6; a heat shield 8 provided along the inside face of the heat insulating body 7; and a melt surface flow-straightening member 12 arranged in the vicinity of the melt surface 2d of the silicon melt 2a.

The crucible 2 comprises two members: for the portion in which the silicon melt 2a is stored, a quartz ($SiO_2$) crucible 3 is employed, and a graphite (C) crucible 4 is employed for holding and keeping hot the quartz crucible 3, covering the bottom and side face of the quartz crucible 3.

The inside end P of the flow-straightening member 12 is arranged having a prescribed distance from the melt surface 2d while its other end Q is arranged so as to contact the upper edge of the heat shield 8.

A single crystal 2b can be manufactured by melting silicon raw material in the quartz crucible 3 and pulling a crystal upwards in the Figure while the crystal is grown, from a seed crystal, not shown, using a pulling mechanism 2e, from the melt surface 2d.

However, in the manufacture of silicon single crystals, the quartz crucible 3 and the Si of the silicon melt 2a undergo an interface reaction, generating SiO; this SiO mixes with the silicon melt 2a. This SiO is highly volatile and easily evaporates from the melt surface 2d.

This SiO condenses and adheres on the inner wall 1c of the chamber 1, the surface of the single crystal 2b, and components in the vicinity of the crucible 2, which are at comparatively low temperature; this adhering SiO again exfoliates therefrom, and may become mixed as foreign matter with the silicon melt 2a. Such foreign matter results in the crystal growing from the melt surface 2d becoming polycrystalline and, as a result, the yield of silicon single crystals is lowered.

Accordingly, in order to raise the yield of silicon single crystals, a melt surface flow-straightening member 12 is provided in the vicinity of above the melt surface 2d, so as to direct inert purge gas introduced from a purge gas introduction port 1d provided in a cylinder 1a by the flow-straightening member 12: the SiO evaporated from the melt surface 2d is thereby entrained in the purge gas and is then discharged to outside the chamber 1 from a discharge port 1e. The flow of purge gas is indicated in the Figure by the arrows G1 to G4.

Additionally, it is known that the above-mentioned dopants bond with oxygen, present in trace amounts in the silicon melt 2a, and evaporate as volatile oxides from the melt surface 2d. For example, when silicon single crystals doped with Sb are pulled there is considerable evaporation of the volatile dopant oxide $Sb_2O_3$ from the melt surface 2d.

In particular, if a melt surface flow-straightening member 12 is present, when seeking to obtain silicon single crystals of low resistivity by doping the silicon raw material with Sb, evaporation of $Sb_2O_3$ is further promoted by the flow-directing action and flow speed effect of the purge gas, so silicon single crystals of the desired low resistivity cannot be obtained with high controllability.

Furthermore, as described above, it is necessary to control the oxygen concentration of the silicon single crystals to a prescribed value in order to raise the IG effect of the wafer, but evaporation of SiO and dopant oxides is promoted by the use of the melt surface flow-straightening member 12 with the result that the oxygen concentration in the silicon single crystal cannot be controlled in high concentration.

Accordingly, Patent Reference 1 discloses a technique wherein, by suitable modification of the shape of the flow-straightening member, the flow rate of purge gas in the vicinity of the melt surface is reduced as far as possible, thereby suppressing evaporation of dopant oxide and preventing lowering of the oxygen concentration of the silicon single crystal.

Also, Patent Reference 2 discloses techniques for preventing the oxygen concentration in the silicon single crystal from being lowered, by raising the pressure in the chamber and suppressing evaporation of dopant oxide, and for discharging the SiO to the outside of the chamber by employing a high-speed gas purge current as curtain gas in order to prevent condensation and adhesion of the SiO, which is evaporated and diffused from the melt surface, on the inner walls of the chamber.

Patent Reference 1
Japanese Patent Application Laid-Open No. 07-232994.
Patent Reference 2
Japanese Patent Application Laid-Open No. 10-182289.

DISCLOSURE OF THE INVENTION

Problems to be Solved by the Invention

However, in the case of the device disclosed in Patent Reference 1, a construction is adopted wherein the purge gas is diffused within the chamber by passing through a part of the gas flow-straightening member, so SiO condenses and adheres to the chamber inner wall, which is at comparatively low temperature, and thus cannot be prevented from again exfoliating and becoming mixed with the melt as foreign matter, thereby making it difficult to raise the single crystal yield. Also, reducing the purge gas flow rate in the vicinity of the melt surface was inconsistent with the technical concept of discharging evaporated substances to outside the chamber by entraining these in the purge gas.

Also, if, as in the case of the device disclosed in Patent Reference 2, the pressure in the chamber is raised in order to suppress evaporation of the dopant oxide, the effectiveness of the curtain gas is weakened. Consequently, the SiO evaporated from the melt surface is diffused and condenses on and adheres to the chamber inner wall and other locations, from which it again exfoliates and mixes with the melt as foreign matter: this made it difficult to obtain silicon single crystals in high single crystal yield. Also, there was the problem that the construction required in order to obtain the curtain gas became complicated.

Furthermore, the tests conducted by the inventors of the present application established that the silicon single crystal yield and resistivity show considerable dependence on specific parameters such as for example the purge gas pressure, gas flow rate and flow speed. That is, in manufacture of silicon single crystals using the CZ method, it is necessary to constantly optimize the parameters of the purge gas that is introduced into the chamber simultaneously with conducting counter-measures against SiO foreign matter.

The present invention was made in view of the above problems, its object being to provide a semiconductor single crystal manufacturing device and manufacturing method using the CZ method wherein the resistivity and oxygen concentration of the silicon single crystal can be controlled and wherein the single crystal yield can be improved.

In order to achieve the above object, according to a first aspect of the invention there is provided a semiconductor single crystal manufacturing device comprising: a crucible for storing raw material melt for a semiconductor single crystal; a heater that is provided at a periphery of a crucible and that heats and melts the raw material; and a chamber having the crucible and the heater provided therein, in which a seed crystal is immersed in the melt and the single crystal is pulled up; wherein the chamber has formed therein a purge gas directing path whereby purge gas is directed to the vicinity of the surface of the melt in the crucible by flowing down from a purge gas introduction port, is directed to above the heater from the surface of the melt in the crucible, and is directed to a purge gas discharge port from above the heater, and the semiconductor single crystal manufacturing device further comprises purge gas control means for controlling the flow speed of the purge gas passing through the vicinity of the surface of the melt in the crucible from 0.2 to 0.35 m/min when the semiconductor single crystal is pulled.

According to the second aspect of the invention, in the first aspect of the invention, the purge gas directing path comprises three divided flow-straightening members, namely, a cylindrical single crystal side flow-straightening member, a melt surface side flow-straightening member having an inverted conical tube, and a cylindrical heater side flow-straightening member.

According to a third aspect of the invention, in the second aspect of the invention, the single crystal side flow-straightening member is constituted by linking a plurality of members.

According to a fourth aspect of the invention, in the third aspect of the invention, means is provided for altering the arrangement of the plurality of members when the semiconductor single crystal is pulled.

According to a fifth aspect of the invention, in the second aspect of the invention, the melt surface side flow-straightening member and heater side flow-straightening member are formed of graphite material and at least a portion of the single crystal side flow-straightening member is formed of graphite material.

According to a sixth aspect of the invention, there is provided a method for manufacturing a semiconductor single crystal using a semiconductor single crystal manufacturing device having: a crucible for storing raw material melt for a semiconductor single crystal; a heater that is provided at the periphery of the crucible and that heats and melts the raw material; and a chamber having the crucible and the heater provided therein, in which a seed crystal is immersed in the melt and the single crystal is pulled up, wherein the chamber has formed therein a purge gas directing path which defines the crucible, the heater and the inner wall of the chamber, and whereby purge gas is directed to the vicinity of the surface of the melt in the crucible by flowing down from a purge gas introduction port, is directed to above the heater from the surface of the melt in the crucible, and is directed to a purge gas discharge port from above the heater, the single crystal being pulled with the flow speed of the purge gas passing through the vicinity of the melt surface controlled from 0.2 to 0.35 m/min.

According to a seventh aspect of the invention, in the sixth aspect of the invention, the purge gas directing path comprises three divided flow-straightening members, namely, a cylindrical single crystal side flow-straightening member, a melt surface side flow-straightening member having an inverted conical tube, and a cylindrical heater side flow-straightening member.

According to an eighth aspect of the invention, in the seventh aspect of the invention, the single crystal side flow-straightening member is constituted by linking a plurality of members.

According to a ninth aspect of the invention, in the eighth aspect of the invention, the arrangement of the plurality of members is altered when the semiconductor single crystal is pulled.

According to a tenth aspect of the invention, in the sixth aspect to the ninth aspect of the invention, when silicon raw material is introduced into the crucible, the single crystal side flow-straightening member and the melt surface side flow-straightening member are separated from a quartz crucible, and after the silicon raw material is melted in the crucible, the two flow-straightening members are arranged in prescribed positions, and the single crystal is then pulled.

With the first aspect of the invention, as shown in FIG. 1, a purge gas directing path 100 is formed, so there is no possibility of SiO adhering to the chamber inner wall $1c$ being again exfoliated and mixing as foreign matter with the silicon melt $2a$; hence the silicon single crystal can be manufactured with a high single crystal yield. Also, manufacture of a silicon single crystal of low resistivity with high single crystal yield can be achieved by controlling the purge gas flow speed in a range of from 0.2 to 0.35 m/min in the vicinity of the melt surface $2d$.

With the second aspect of the invention, the flow-straightening members are formed independently rather than as an integral body, so the flow-straightening members are easily arranged in the chamber 1 and the flow-straightening members can be moved independently within the chamber 1 in accordance with requirements.

With the third aspect of the invention, since the single crystal side flow-straightening member is constituted by linking a plurality of members, when the raw material has melted or when the single crystal is pulled, these members can be moved independently in accordance with requirements.

With the fourth aspect of the invention, each member can be arranged in an optimal position in order to improve the properties of the silicon single crystal and the rate of crystallization.

With the fifth aspect of the invention, most of the flow-straightening members forming the purge gas directing path 100 are of graphite material, so they cannot cause heavy-metal contamination and, even when exposed to high-temperature for a long period, there is no possibility of deformation of the flow-straightening members.

With the sixth aspect of the invention, by means of the device shown in FIG. 1, even in the case of melt doped with volatile dopant, evaporation from the melt surface $2d$ can be suppressed with high controllability by employing a high-pressure atmosphere within the chamber 1 and reduction of the dopant concentration or oxygen concentration in the silicon single crystal can therefore be avoided. Also, by controlling the purge gas flow speed in the vicinity of the melt surface $2d$ in the range from 0.2 to 0.35 m/min, it is possible to obtain silicon single crystals of low resistivity and high IG effect, yet also with high single crystal yield.

With the seventh aspect of the invention, the purge gas directing path is formed by three divided flow-straightening members, namely, a cylindrical single crystal side flow-straightening member, a melt surface side flow-straightening member having an inverted conical tubular shape and a cylindrical heater side flow-straightening member, so a silicon single crystal of the desired performance can be pulled.

With the eighth aspect of the invention, the single crystal side flow-straightening member is constituted by linking a plurality of members, so a silicon single crystal can be pulled with these members being moved independently in accordance with requirements.

With the ninth aspect of the invention, the performance and crystallization rate of the silicon single crystal can be improved by arranging the members in optimal positions.

With the tenth aspect of the invention, in FIG. 1 and FIG. 3, when the silicon raw material is introduced into the quartz crucible 3, the single crystal side flow-straightening member 11 and the melt surface side flow-straightening member 12 are separated from the quartz crucible 3 and the silicon raw material is melted in the crucible 3; the two flow-straightening members 11, 12 are then arranged in prescribed positions; and the single crystal is then pulled, so introduction of the silicon raw material and subsequent pulling of the single crystal can easily be performed.

(a) and (b) of FIG. 2 are views showing the relationship between the purge gas introduction conditions and silicon single crystal properties in silicon single crystal manufacture.

Figure 3:
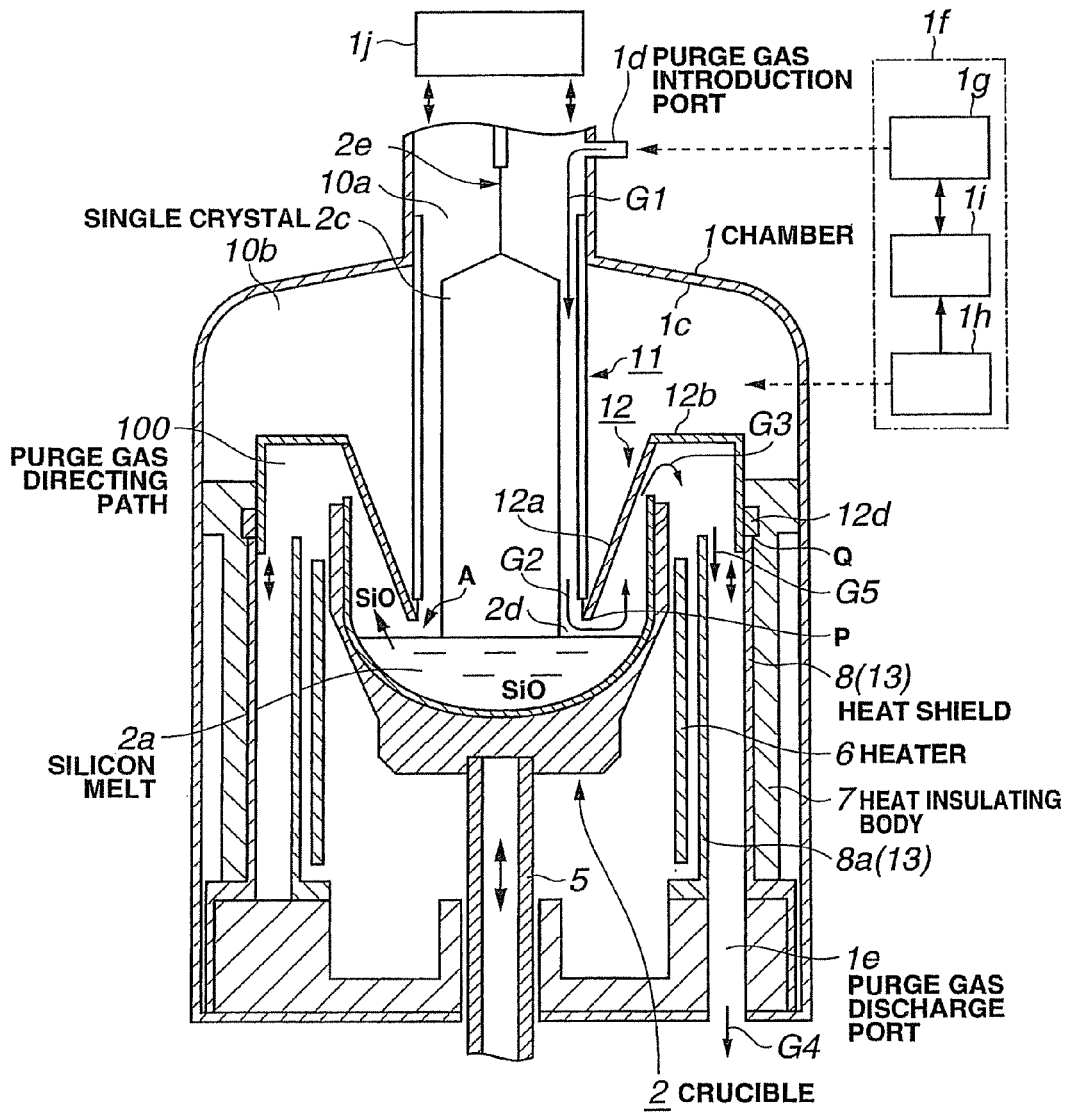

FIG. 3 is a diagram showing another embodiment of the present invention.

Figure 4:
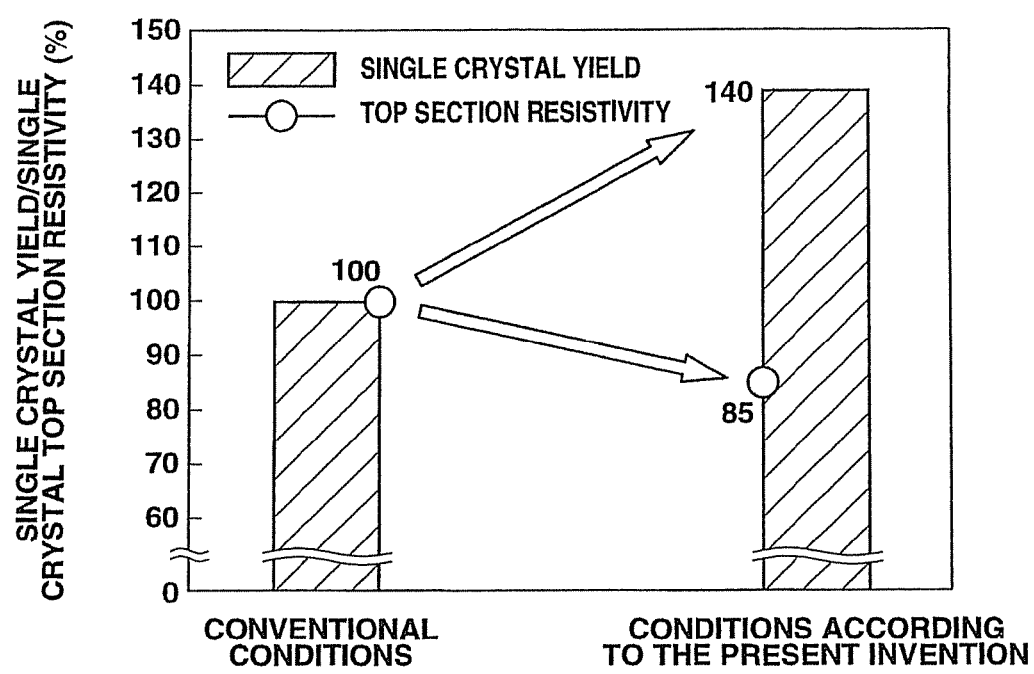

FIG. 4 is a view showing a comparison of the single crystal yields and resistivities of single crystals according to the present invention and conventional single crystals.

Figure 5:
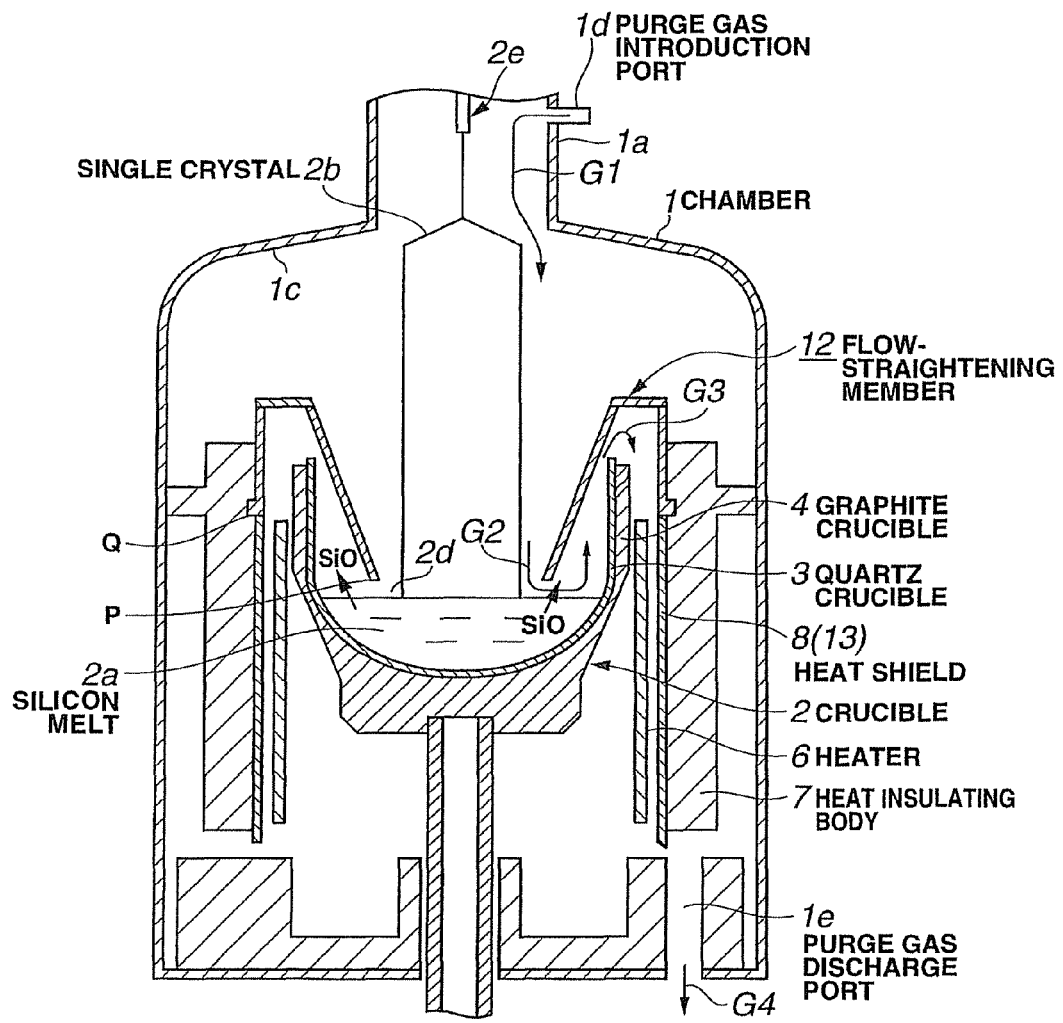

FIG. 5 is a diagram given in explanation of a conventional device.

EXPLANATION OF THE REFERENCE SYMBOLS 1 chamber
1b cylinder inner wall
1c chamber inner wall
1d purge gas introduction port
1e purge gas discharge port
2 crucible
2a silicon melt
2b, 2c single crystals
2d melt surface
2e pulling mechanism
3 quartz crucible
4 graphite crucible
5 shaft
6 heater
7 heat insulating body
8, 8a heat shields
9 inspection window
10 wall
10a internal space
10b external space
11 single crystal side flow-straightening member
12 melt surface side flow-straightening member
13 heater side flow-straightening member
100 purge gas directing path

BEST MODE FOR CARRYING OUT THE INVENTION

The semiconductor single crystal manufacturing device and manufacturing method according to the present invention are described below with reference to the drawings.

As described above, in silicon single crystal manufacture, SiO condensing and adhering within the chamber 1 is exfoliated and again becomes mixed with the silicon melt 2a as foreign matter, lowering the yield of silicon single crystals, so countermeasures in respect of SiO inclusions are necessary.

However, tests by the inventors of the present application and others have revealed that the silicon single crystal yield and resistivity show considerable dependence on the purge gas flow speed in the vicinity of the melt surface 2d.

Consequently, in the manufacture of silicon single crystals, concurrently with counter-measures against SiO inclusions, it is necessary to optimize the purge gas introduction conditions.

Embodiment 1

Figure 1:
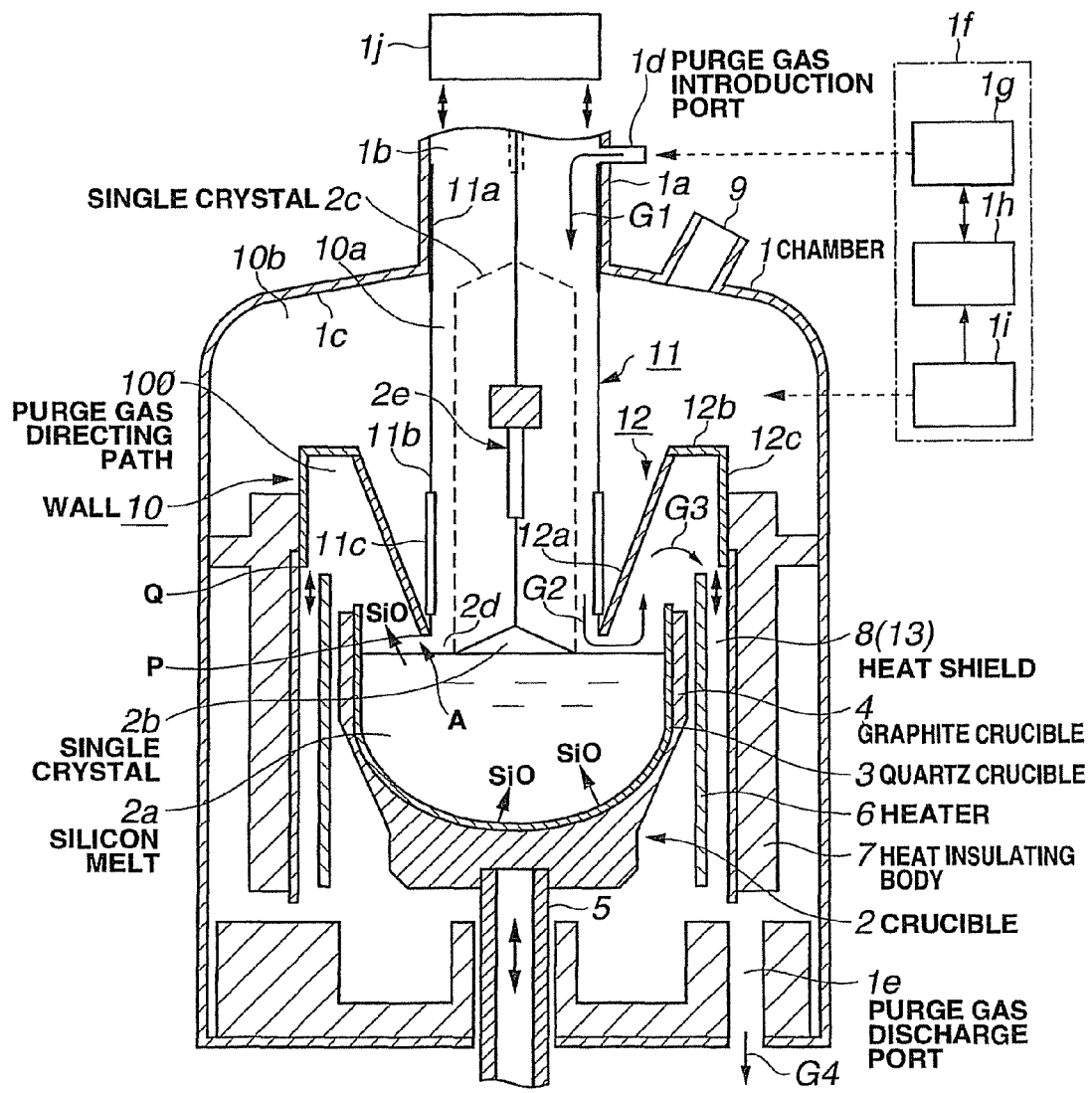
FIG. 1 is a diagram showing an embodiment of the present invention.

FIG. 1 is a diagram given in explanation of Embodiment 1 of the present invention.

In this FIG. 1, a crucible 2 in a chamber 1 is fixed and connected to a shaft 5 capable movement in the vertical direction in the Figure. Silicon melt 2a is stored in the crucible 2. A heater 6 made of graphite material is arranged at the periphery of the crucible 2. Also, a pulling mechanism 2e for pulling a single crystal as it is grown is suspended from the central portion at the top of a cylinder 1a. For convenience in the following description, the silicon single crystal 2b at the start of pulling is shown in the Figure by continuous lines and the silicon single crystal 2c after it has been grown is shown by broken lines.

A cylindrical heat shield 8 made of graphite material is provided separated with a prescribed distance at the outer periphery of the heater 6. A cylindrical heat insulating body 7 is provided at the outer periphery of the heat shield 8.

At the top on the right of the chamber 1, an inspection window 9 for observing the temperature and crystal condition of the silicon melt 2a during single crystal pulling is provided.

Within the chamber 1, there are defined an internal space 10a and an external space 10b by means of a wall 10 forming a purge gas directing path 100, to be described.

The wall 10 is formed from three flow-straightening members, namely, a single crystal side flow-straightening member 11, melt surface side flow-straightening member 12, and heater side flow-straightening member 13, these being mutually linked by a linking mechanism.

It should be noted that "linking" in the invention of the present application refers not merely to modes such as for example integral linkage by welding means but refers to modes of linkage whereby for example purge gas, evaporated substances or reacting substances cannot pass through the linking locations, and includes for example modes such as butt welding, superposition, or fitting together.

The flow-straightening member 11 comprises a construction produced by linking three cylindrical tubes having a prescribed length and thickness, the internal diameters of all of the tubes being larger than the maximum diameter of the single crystal that is pulled. The values of these diameters may be determined taking into account flow straightening ability of the purge gas.

The upper end of an upper tube 11a provided at the top is held by being linked with the cylindrical inner wall 1b. The upper end of a middle tube 11b provided in the middle is linked with the bottom end of the upper tube 11a. The lower end of the middle tube 11b is linked with the upper end of the bottom tube 11c provided at the bottom. The bottom end of the bottom tube 11c is linked with one end of a melt surface side flow-straightening member 12, described below.

Also, the three tubes 11a, 11b, 11c can be independently raised and lowered, so that each tube can be suitably shifted in the vertical direction in order to improve the performance of the single crystals and single crystal yield when the silicon single crystal is pulled.

The upper tube 11a and middle tube 11b are both made of graphite material with little variation of thermal history, and the length and thickness of the tubes can be suitably altered for controlling the temperature history of the silicon single crystal that is to be pulled. Also, the lower tube 11c is made of quartz material so as to permit observation of the temperature of the melt surface or of the state of growth of the single crystal or of the position of the melt surface from the inspection window 9. In some cases, part of the lower tube 11c may be made of quartz material and other parts may be made of graphite material.

The melt surface side flow-straightening member 12 is formed from three components. Specifically, a construction is adopted wherein an annular flange 12b that extends outwards in the horizontal direction is linked at the top end of an inverted conical tube 12a and, in addition, an outer tube 12c is linked so as to be suspended from the outer edge of the flange 12b. Consequently, there is a minimum distance between the bottom end P of the inverted conical tube 12a and the melt surface 2d. Using the mechanism of a shaft 5, the position of the quartz crucible 2 is suitably adjusted matching the pulling of the silicon single crystal, thereby making it possible to set the distance between the bottom end P of the inverted conical tube 12a and the melt surface 2d to a prescribed value.

In Embodiment 1, a flow-straightening member raising/lowering mechanism 1j is provided above the cylinder 1a. The flow-straightening member raising/lowering mechanism 1j has a construction such as to shift the single crystal side flow-straightening member 11 and the melt surface side flow-straightening member 12 in the vertical direction in the Figure. For example, the flow-straightening members 11 and 12 may be suitably shifted in the vertical direction in the Figure by coiling/uncoiling wire.

Also, when the silicon raw material is introduced into the crucible by means of the flow-straightening member raising/lowering mechanism 1j, the single crystal side flow-straightening members 11 and the melt surface side flow-straightening member 12 are separated in the upper space of the chamber 1 from the quartz crucible 3, so that, after the silicon raw material is melted in the quartz crucible 3, the flow-straightening members 11 and 12 can be arranged in prescribed positions.

Thus, by using a flow-straightening member raising/lowering mechanism 1j, the introduction of the silicon raw material is facilitated and, after introduction of the silicon raw material, the flow-straightening members 11, 12 can be returned once more to their prescribed positions, so subsequent pulling of the single crystal can easily be performed.

Next, the purge gas directing path 100 will be described.

A purge gas introduction port 1d that is provided in the cylindrical inner wall 1b of the chamber 1, the vicinity of the melt surface 2d, the vicinity of the heater 6, and the purge gas discharge port 1e are linked by means of a wall 10 formed by linking the above three flow-straightening members 11, 12 and 13; a purge gas directing path 100 is thereby formed constituting a passage through which purge gas introduced from the gas introduction port 1d flows as it is directed through this linked space.

The purge gas is directed and flows downwards to the vicinity of the melt surface 2d from the gas introduction port 1d, as shown by the arrow G1, without diffusing into the external space 10b owing to the flow-straightening member 11. The purge gas that reaches the vicinity of the melt surface 2d is directed in the output direction of the melt surface 2d by the flow-straightening member 12 as shown by the arrow G2; it is then first directed above the crucible 3 and is then directed downwards again as shown by the arrow G3.

The purge gas that has been directed downwards flows through the gap formed by the heater 6 and the flow-straightening member 13 and is discharged from the purge gas discharge port 1e that is provided at the bottom of the chamber 1 as shown by the arrow G4. It should be noted that some of the purge gas reached the bottom end of the flow-straightening member 13 can diffuse in the space in the chamber 1.

The shape of the purge gas directing path 100 changes with growth of the silicon single crystal and consumption of the silicon melt. At this stage of commencement of growth of a single crystal 2b, the purge gas introduced from the gas introduction port 1d is directed by the flow-straightening member 11 and flows down towards the melt surface 2d. Also, at this stage where the single crystal 2c has grown, the purge gas is directed through the gap formed at the side faces of the flow-straightening member 11 and the single crystal 2c.

Now, as mentioned above, volatile substances such as SiO and dopant oxides are continually evaporated from the melt surface 2d.

The wall 10 forming the purge gas directing path 100 defines the crucible 2, the heater 6 and inner wall 1c of the chamber, so the above volatile substances are prevented from directly diffusing onto and condensing and adhering to the chamber inner wall 1c. Also conversely, the wall 10 prevents mixture of foreign matter generated at the side of the chamber inner wall 1c with the silicon melt 2a.

In particular, in case of SiO which evaporates largely, conventionally, the SiO was readily condensed on and adhered to the inner wall 1c of the chamber, which is at comparatively low temperature; consequently, it could not be avoided that this SiO was subsequently exfoliated and became mixed in the melt as foreign matter; however, by virtue of the formation of the wall 10, mixing of such foreign matter with the melt can be avoided.

Also, since the purge gas directing path 100 can direct the purge gas continuously by means of the wall 10, the flow-straightening ability of the purge gas can be improved. Consequently, volatile substances such as SiO evaporating from the melt surface 2d are efficiently entrained in the purge gas and can be discharged to outside the chamber 1 and deposition thereof on peripheral components is suppressed.

In addition, purge gas control means 1f is provided in the device according to Embodiment 1. The purge gas control means 1f comprises a purge gas flow rate control unit 1g and a pressure meter 1h and calculation unit 1i.

The flow speed S of the purge gas passing through the vicinity of the melt surface 2d can be set at a prescribed value as indicated below.

Let us define the total passage cross-sectional area between the inside end P of the melt surface side flow-straightening member 12 and the melt surface 2d as A. This total passage cross-sectional area A is a value obtained by multiplying the circumferential length of the end P by the distance between the end P and the melt surface 2d. Let the amount of purge gas introduced from the purge gas introduction port 1d per unit time be V. Also, let the pressure in the chamber 1 at this point be P. If the flow speed of the purge gas passing through this passage cross-section is assumed to be S, S=CV/AP is obtained by the gas flow relationship equation V=C×ASP (where C is a constant). The calculation unit 1i performs calculation in accordance with this gas flow relationship equation.

Setting of the purge gas flow speed S can be performed by controlling the purge gas flow rate control unit 1g with the purge gas introduction rate V per unit time calculated by the calculation unit 1i.

FIG. 2(a) and FIG. 2(b) show the relationships of the purge gas introduction conditions and silicon single crystal characteristics when a silicon single crystal manufacturing device as described above is employed.

FIG. 2(a) and FIG. 2(b) show the relationships of the single crystal yield and resistivity (ρ) with respect to the purge gas introduction conditions (parameters: purge gas pressure in the chamber, Ar gas flow rate, purge gas flow speed in the vicinity of the melt surface 2d). In FIG. 2(a) and FIG. 2(b), there are 16 purge gas introduction conditions.

According to the overall evaluation of FIG. 2(a) and FIG. 2(b), the conditions that qualify in respect of both single crystal yield and resistivity (locations indicated by O in the Figure) are the conditions 9 to 12 in FIG. 2(a) and the conditions 10 to 13 in FIG. 2(b). In this case, the purge gas flow speeds in the vicinity of the melt surface 2d are in the range of approximately from 0.2 to 0.35 (m/min). On the other hand, the pressure range is 200 to 760 (Torr) and the Ar gas flow rate is a broad range of 100 to 400 (l/min).

Specifically, according to the data of FIG. 2(a) and FIG. 2(b), in silicon single crystal manufacture, the first essential is to set the purge gas flow speed in the vicinity of the melt surface 2d in the prescribed range of (from 0.2 to 0.35 (m/min)); next, the pressure in the chamber 1 and Ar gas flow rate may be set.

As described above, silicon single crystals can be obtained in stable fashion with low resistivity and high single crystal yield with a silicon single crystal manufacturing device and manufacturing method according to Embodiment 1, by performing SiO inclusion counter-measures using a flow-straightening member, and optimizing the introduction parameters of the purge gas.

Also, by keeping the purge gas flow speed in the prescribed range and passing purge gas under high gas pressure atmosphere conditions in accordance with the data of FIG. 2(a) and FIG. 2(b), evaporation of dopant oxides from the melt surface 2d can be suppressed with excellent controllability, so silicon single crystals of high oxygen concentration and excellent IG effect can be obtained.

Embodiment 2

FIG. 3 is a diagram given in explanation of another embodiment of the present invention.

In this Figure, the difference from Embodiment 1 lies chiefly in the melt surface side flow-straightening member 12 and the heater side flow-straightening member 13. The description given below will therefore focus on these.

The flow-straightening member 12 is formed from four components. Specifically, a construction is adopted wherein an annular flange 12b that extends outwards in the horizontal direction is linked at the top end of an inverted conical tube 12a and, in addition, an outer tube 12c is linked so as to be suspended from the outer edge of the flange 12b. In addition, an annular flange 12d that extends outwards in the horizontal direction is linked at the bottom end of the outer tube 12c and the outside end Q of the outer tube 12d is linked in inscribed fashion on the inside at the upper end of a cylindrical heat shield 8.

The heater side flow-straightening member 13 is constituted by two members, namely, the heater 6 and an internal shield 8a.

The internal shield 8a is provided between the heater 6 and the heat shield 8. The upper end of the shield 8a is separated by a prescribed distance from the bottom of the annual flange 12d and the purge gas is directed through this gap. Also, the bottom ends of the heat shields 8 and 8a are connected by a linkage with a discharge port 1e provided at the bottom of the chamber 1.

Thanks to the above construction of the purge gas directing path 100, although the flow of the purge gas is exactly the same as in Embodiment 1 as far as indicated by the arrow G3, thereafter, the purge gas flows through the gap between the shields 8 and 8a as shown by the arrow G5 while the purge gas is restricted to flow to the side of the heater 6; subsequently, the purge gas is discharged from the discharge port 1e without diffusing in the space within the chamber 1.

In the case of the purge gas directing path 100 of Embodiment 2, even more stable flow straightening ability can be achieved than with Embodiment 1.

Also, even if the purge gas flow speed is made large while maintaining flow straightening ability, since promotion of evaporation from the silicon melt surface 2d can be suppressed by setting a high pressure as the purge gas conditions, reduction in the dopant content or oxygen content of the silicon melt 2a can be suppressed by the flow-straightening effect and flow speed effect.

Furthermore, by setting the purge gas conditions to high pressure and high flow speed, the effect of entraining of evaporated substances such as SiO, which are a cause of inclusions, into the purge gas directing path can be increased, with the result that the yield of silicon single crystals can be improved.

Furthermore, by adopting the above construction, it is possible to suppress the extent to which evaporated substances generated from the crucible 3 react by coming into contact with the surface of the heater 6 in a high-temperature condition, generating fresh reactive substances.

FIG. 4 shows a comparison of silicon single crystals manufactured by a device according to the present invention with silicon single crystals manufactured by a conventional device.

In FIG. 4, the yield of silicon single crystals is increased by about 40%, when the yield obtained according to the present invention is compared with the conventional yield as a reference. Also, looking at the top section resistivity of the initial portion of growth of the single crystal, in the case of the present invention, the resistivity is lowered by about 15% compared with conventionally.

As described above, with the silicon single crystal manufacturing device and manufacturing method according to the present invention, the yield of silicon single crystals can be raised and the resistivity of the silicon single crystals i.e. of the wafers can be lowered. Also, since the oxygen concentration of the silicon melt 2a can be controlled to a high value, silicon single crystals with an excellent IG effect can be obtained.

Also, since the flow straightening ability of the purge gas by the purge gas directing path 100 is high, even if evaporated substances evaporated from the melt surface 2d react with the crucible periphery or high-temperature surface of the heater 6, generating reaction products, mixing of these with the melt 2a by back-flow along the purge gas directing path 100 can be avoided. That is, high-purity silicon single crystals of a low degree of contamination can be obtained.

Also, the device of the present invention is ideal in that, when, in order to obtain single crystals of low resistivity, the silicon melt 2a is doped with for example arsenic (As), antimony (Sb) or phosphorus (P) or the like, all of these elements and their oxides can easily be evaporated.

In the invention of the present application, when the dopant is arsenic, the doping rate is set such that the resistivity of the silicon single crystal is no more than a maximum of 3 (mΩ), preferably no more than 2 (mΩ). When the dopant is antimony, the doping rate is set such that the resistivity of the silicon single crystal is no more than a maximum of 15 (mΩ), preferably no more than 10 (mΩ). Also, when the dopant is phosphorus, the doping rate is set such that the resistivity of the silicon single crystal is no more than a maximum of 1.5 (mΩ), preferably no more than 1.0 (mΩ).

Also, a suitable range of purge gas pressure in the application of the present invention is 200 to 760 (Torr).

It should be noted that the shape of the wall 10 of the purge gas directing path 100 according to the present invention is not particularly restricted to the two embodiments disclosed above and could be suitably modified without departing from the gist of the present invention. Also, although a silicon single crystal manufacturing device and manufacturing method have been described in the above embodiments, the present invention could be suitably applied to other semiconductor materials.

INDUSTRIAL APPLICABILITY

By employing the single crystal manufacturing device and manufacturing method according to the present invention, high-performance single crystals can be obtained in high yield and wafers for high-performance semiconductor elements can thereby be supplied to the market in a stable fashion.

The invention claimed is:

1. A semiconductor single crystal manufacturing device comprising: a crucible for storing raw material melt for a semiconductor single crystal; a heater that is provided at a periphery of the crucible and that heats and melts the raw material; and a chamber having the crucible and the heater provided therein, in which a seed crystal is immersed in the melt and the single crystal is pulled up, characterized in that a wall forming a purge gas directing path is formed by a cylindrical single crystal side flow-straightening member, a melt surface side flow-straightening member having an inverted conical tube and a cylindrical heater side flow-straightening member, and the wall forming the purge gas directing path defines the crucible and the heater, and an inner wall of the chamber, the purge gas directing path directs purge gas to flow from a purge gas introduction port to a vicinity of a surface of the melt in the crucible, directs the purge gas to above the heater from the surface of the melt in the crucible, and then directs the purge gas to a purge gas discharge port from above the heater, the semiconductor single crystal manufacturing device comprises a flow-straightening member raising/lowering mechanism which moves the single crystal side flow-straightening member and the melt surface side flow-straightening member in a vertical direction of the chamber, and control means that controls the flow-straightening member raising/lowering mechanism so that, when the raw material is introduced into the crucible, the single crystal side flow-straightening member and the melt surface side flow-straightening member are separated from the crucible in an upwards direction and, after the raw material is melted in the crucible, the single crystal side flow-straightening member and the melt surface side flow-straightening member are arranged in predetermined positions, to thereby control a flow speed of the purge gas passing through a vicinity of the surface of the melt in the crucible to a desired value.

2. The semiconductor single crystal manufacturing device according to claim 1, characterized in that the single crystal side flow-straightening member is constituted by linking a plurality of members.

3. The semiconductor single crystal manufacturing device according to claim 2, further comprising means that alters an arrangement of the plurality of members independently when the semiconductor single crystal is pulled.

4. The semiconductor single crystal manufacturing device according to claim 1, characterized in that the melt surface side flow-straightening member and the heater side flow-straightening member are formed of a graphite material and at least a portion of the single crystal side flow-straightening member is formed of the graphite material.

5. A method for manufacturing a semiconductor single crystal using a semiconductor single crystal manufacturing device having: a crucible for storing raw material melt for a semiconductor single crystal; a heater that is provided at a periphery of the crucible and that heats and melts the raw material; and a chamber having the crucible and the heater provided therein, in which a seed crystal is immersed in the melt and the single crystal is pulled up, comprising the steps of:

forming a wall for a purge gas directing path with a cylindrical single crystal side flow-straightening member, a melt surface side flow-straightening member having an inverted conical tube and a cylindrical heater side flow-straightening member, and defining the crucible and the heater, and an inner wall of the chamber, with the wall forming the purge gas directing path, the utilizing the purge gas directing path to direct a purge gas to flow from a purge gas introduction port to a vicinity of a surface of the melt in the crucible, directing the purge gas to above the heater from the surface of the melt in the crucible, and then directing the purge gas to a purge gas discharge port from above the heater, with the wall forming the purge gas directing path, when the raw material is introduced into the crucible by means of the flow-straightening member raising/lowering mechanism, separating the single crystal side flow-straightening member and the melt surface side flow-straightening member from the crucible toward an upper space of the chamber and, after the raw material is melted in the crucible, arranging the single crystal side flow-straightening member and the melt surface side flow-straightening member in prescribed positions, and thereby controlling a flow speed of purge gas passing through a vicinity of the surface of the melt in the crucible to a desired value, and then pulling the single crystal up.

6. The method for manufacturing a semiconductor single crystal according to claim 5, characterized in that the single crystal side flow-straightening member is constituted by linking a plurality of members.

7. The method for manufacturing a semiconductor single crystal according to claim 6, characterized in that the arrangement of the plurality of members is independently altered when the single crystal is pulled.

* * * * *